Figure 1:
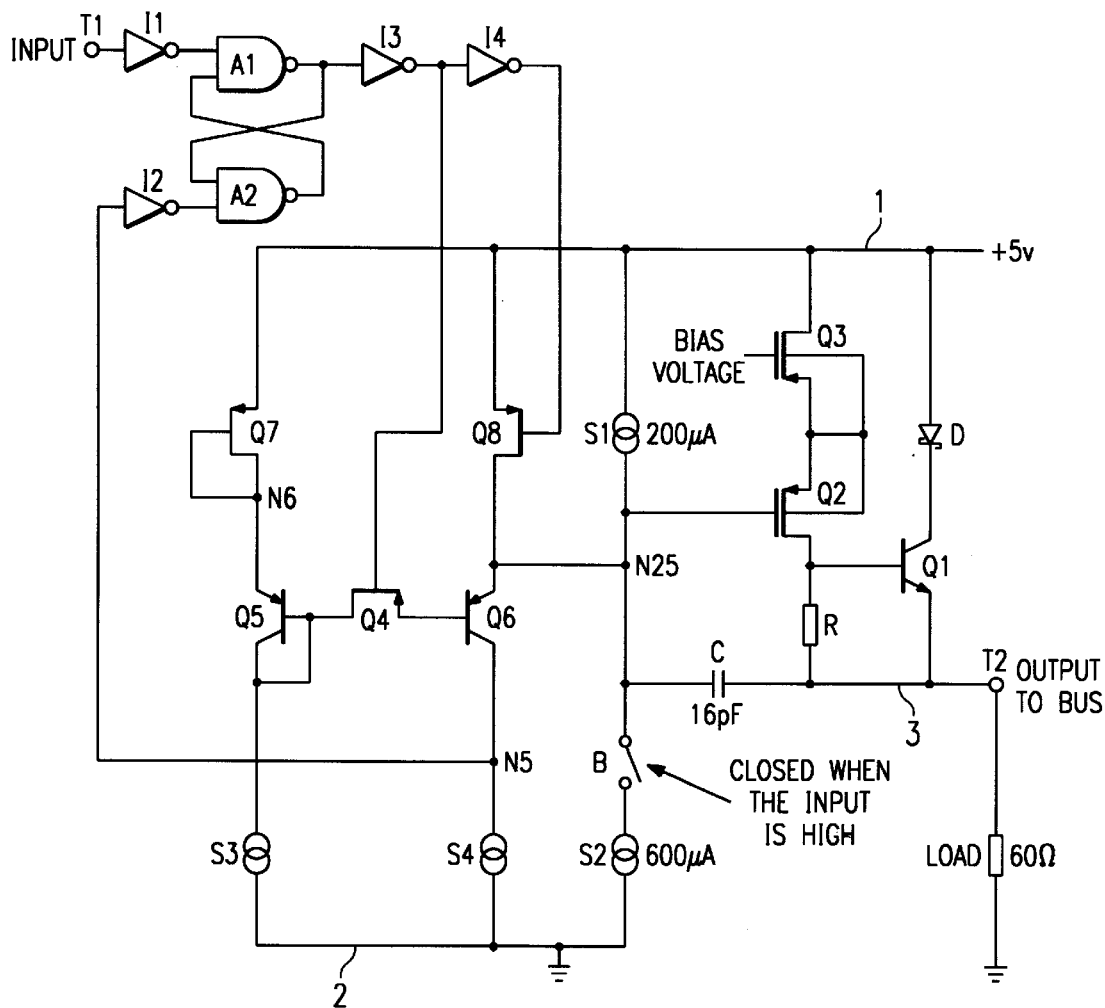

United States Patent [19]
Fattori et al.

[11] Patent Number: 5,959,482
[45] Date of Patent: Sep. 28, 1999

[54] CONTROLLED SLEW RATE BUS DRIVER CIRCUIT HAVING A HIGH IMPEDANCE STATE

[75] Inventors: Frank Fattori, Freising, Germany; Marco Corsi, Dallas, Tex.; Derek Colman, Bedford, United Kingdom

[73] Assignee: Texas Instruments Incorporated, Dallas, Tex.

[21] Appl. No.: 08/911,850

[22] Filed: Aug. 15, 1997

Related U.S. Application Data

[63] Continuation of application No. 08/521,862, Aug. 31, 1995, abandoned.

[30] Foreign Application Priority Data

Aug. 31, 1994 [GB] United Kingdom .................. 9417689

[51] Int. Cl.[6] ............................. H03K 17/30; H03K 5/12
[52] U.S. Cl. ......................... 327/170; 327/130; 327/337; 326/125
[58] Field of Search .................................. 327/170, 130, 327/134, 336, 337, 108, 131, 132; 326/125

[56] References Cited

U.S. PATENT DOCUMENTS

| | | | |
|---|---|---|---|
| Re. 34,899 | 4/1995 | Gessaman et al. ..................... | 327/101 |
| 3,621,281 | 11/1971 | Hagen ..................................... | 327/132 |
| 4,320,521 | 3/1982 | Balakrishnan et al. ................. | 327/170 |
| 4,504,779 | 3/1985 | Haman ................................... | 327/170 |
| 4,593,206 | 6/1986 | Neidorff et al. ......................... | 326/31 |
| 4,855,626 | 8/1989 | Bohme ................................... | 327/336 |
| 4,857,863 | 8/1989 | Ganger et al. .......................... | 327/108 |
| 5,194,760 | 3/1993 | Braun et al. ............................ | 327/170 |
| 5,757,217 | 5/1998 | Thompson .............................. | 326/29 |
| 5,767,703 | 6/1998 | Fattori et al. ........................... | 327/108 |

*Primary Examiner*—Timothy P. Callahan
*Assistant Examiner*—Terry L. Englund
*Attorney, Agent, or Firm*—William B. Kempler; Richard L. Donaldson

[57] ABSTRACT

A driver amplifier for a bus feeds single polarity signals of controlled slew rate to the bus. The slew rate control is effected by a feedback capacitor connected from the output to the input of the amplifier. A clamp is provided for selectively connecting the input of the amplifier through a low impedance path to a point of reference voltage so that when the amplifier is quiescent signals on the bus cannot be fed through the capacitor to turn on the amplifier. A current source and a switchable current sink are connected to the input of the amplifier to change the capacitor to produce the slew rate controlled transitions. Another driver amplifier of the same design but using components of the opposite conductivity type can be used to apply signals of the opposite polarity to the same bus.

10 Claims, 1 Drawing Sheet

CONTROLLED SLEW RATE BUS DRIVER CIRCUIT HAVING A HIGH IMPEDANCE STATE

This application is a Continuation of application Ser. No. 08/521,862 filed Aug. 31, 1995 and now abandoned.

This invention relates to circuits for driving an electrical signal on to a bus conductor.

Electrical bus systems provide conductors to which are connected signal sources and signal destinations, and in many applications a plurality of sources and a plurality of destinations are connected to use the same conductor at different times. It is important where several sources are connected to the same conductor to arrange that when a source is quiescent or not active, that is to say not feeding signals to the conductor, it presents a high impedance to the conductor so as not to absorb energy from the signals that are present on the conductor and attenuate them. It is also important that when a source is active, feeding signals to the conductor, it should have a low impedance, so that it can maintain the required signal levels on the conductor despite the loading imposed by the destinations connected to the conductor.

It is also desirable that the voltage transitions in the signals on the conductor should have a controlled slew rate so as to reduce both ringing on the conductor itself and electromagnetic radiation from the conductor that could interfere with radio communications and the operation of computers in the vicinity of the conductors. The slew rate control is usually effected by the use of a feedback capacitor which can lead to the source being undesirably affected by signals on the conductor when the source is quiescent.

In addition to computer networks, bus systems are employed in motor vehicles and factory and business premises. In such environments substantial electrical interference can appear on the conductors and it is therefore necessary that the sources and destinations connected to the conductors are sufficiently electrically rugged to withstand such interference.

It is an object of the present invention to provide a driver amplifier suitable for use as a source connected to a bus conductor in which the above considerations have been taken into account.

According to the present invention there is provided a bus driver circuit 100 having an output for feeding output binary signals to a bus conductor in response to input signals applied to an input of the bus driver circuit, the output signals having transitions of a controlled slew rate determined by a feedback capacitor connected from the output to the input of the output amplifier 102, the output amplifier 102 including controllable clamp means effective to connect the input of the output amplifier to a point maintained at a reference voltage through a low impedance when the bus driver circuit is not feeding signals to the bus conductor, the reference voltage being such that when clamped the bus driver circuit presents a high impedance to the bus conductor.

The transitions of the output signals may be produced by having a first current source permanently connected to the input of the output amplifier and a second current source selectively connected to that input, the second current source providing a current of the opposite polarity to and of greater magnitude than that from the first current source. The controllable clamp means may comprise a transistor connected in parallel with the first current source, that current source also being connected to the point maintained at the reference potential.

A latch may be provided responsive to the input signals to control the clamp means. The latch may also control a switch connecting a voltage source to the input of the output amplifier to bring that input rapidly to the threshold voltage of the output amplifier to start the ramp defined by the controlled slew rate, so that a signal to be applied to the bus conductor begins very soon after the input signal causing it.

Figure 2A:
Figure 2B:

An example of a driver amplifier will now be described with reference to the accompanying drawings, of which:

FIG. 1 is the circuit diagram of the example;
FIG. 2A shows the waveform of an input signal;
FIG. 2B shows the waveform of an output signal; and
FIG. 3 shows the connection of two bus driver circuits to a two-wire bus.

The example of a bus driver circuit 100 to be described feeds positive voltage representing a binary "1", say, to a bus conductor when active and presents a high impedance feeding no current to the bus conductor representing a binary "0", say, when quiescent or not active. A similar circuit having the polarities and conductivity types reversed could be used to apply negative voltage signals to the same or another bus conductor; this alternative embodiment will not be further described.

In view of the fact that a reversed polarity embodiment of the invention can be made, the current sinks used in the embodiment to be described are termed current sources providing negative currents so that the polarity reversal can be more easily implemented.

In FIG. 1, the output amplifier 102 has a bipolar output transistor Q1, the collector of which is connected through a schottky diode D to a conductor 1 maintained at +5 volts. The emitter of the transistor Q1 is connected to a conductor 3 and to a terminal T2 which can be connected to a bus conductor (not shown) having a load impedance of 60 Ω, represented in the figure as a resistor. The conductor 3 is connected through a capacitor C to a node N25 which acts as the input terminal of the output amplifier although the input signals are applied to other places as explained below. The node N25 is connected to a current source S1 feeding a positive current of 200 μamps from the conductor 1 to the node N25. The node N25 is also connected to the gate of a MOSFET Q2, the drain of which is connected to the base of the transistor Q1 and also through a resistor R to the conductor 3. The source and back gate of the transistor Q2 are connected to the source and back gate of a MOSFET Q3 of which the drain is connected to the conductor 1 and the gate is connected to a bias voltage.

A conductor 2 is connected to ground (0 volt) and to a current source S2 that selectively feeds a negative current of 600 μamps through a switch B to the node N25. Although it is not shown as a mechanical switch, the switch B will probably be an electronic switch in practical circuits and may be incorporated in the current source S2. Two further current sources S3 and S4 feed negative currents respectively to the collector of a diode-connected bipolar transistor Q5 and to the collector of a bipolar transistor Q6 having its emitter connected to the node N25 and to the drain of an FET Q8. The source of the transistor Q8 is connected to the conductor 1. The base of the transistor Q6 is connected to the source of an FET Q4, the drain of which is connected to the base and collector of the transistor Q5. The emitter of the collector Q5 is connected to a node N6 and to both the drain and gate of an FET Q7, the source of which is connected to the conductor 1.

A latch is formed of two NAND gates, A1 and A2, the outputs of each of which is connected to an input of the other. A second input of the NAND gate A1 is connected to receive input signals from a terminal T1 through an inverter I1. A second input of the NAND gate A2 is connected to receive the voltage from a node N5 at the collector of the transistor Q6 through an inverter I2. The output of the NAND gate A1 is connected through a first inverter I3 and then through a second inverter I4. The output of the inverter I3 is connected to the gate of the FET Q4. The output of the inverter I4 is connected to the gate of the FET Q8.

As will become evident from the following detailed description of the operation of the circuit, the transistors Q1 and Q2 form an output amplifier having the capacitor C connected in a feedback path from the output T2 to the input N25 of the output amplifier. The controlled slew rate ramps at the start and finish of a positive signal applied to the bus conductor (at terminal T2) are generated respectively by the current from the source S2 overcoming the current from the source S1 and the current from the source S1 alone. The FET Q8 is the controllable clamp means connecting the output amplifier input node N25 to a reference voltage on the conductor 1, the latch formed by the NAND gates A1 and A2 providing the control. The current source S3 with transistors Q5 and Q7 provide a voltage close to the threshold voltage of the transistor Q2, which is used via the transistors Q4 and Q6 to bring the node N25 rapidly to the threshold voltage (from that of the conductor 1) to avoid delay in applying a signal to the bus conductor.

The bus driver circuit shown in FIG. 1 is responsive to a binary signal input applied to the terminal T1, which is also used to operate the switch B, to apply selectively to a bus conductor connected to the terminal T2 a positive voltage signal having starting and finishing transitions of controlled slew rate. The transistors Q1 and Q2 form the output amplifier and have the capacitor C connected in a feedback path from the terminal T2 to the node N25 connected to the gate of the transistor Q2. The transistor Q2 is connected as a conventional common source amplifier feeding the base of the transistor Q1 which is connected as an emitter follower. The positive-going transitions of the signal applied to the bus conductor are produced by the excess current of the source S2 over the current of the source S1 when the switch B is closed negatively charging the capacitor C. The negative-going transitions of the signal on the bus conductor are produced by the positive charging of the capacitor C by the source S1 alone when the switch B is open-circuit. The transistor Q2 serves to invert the polarity of the signal on the node N25 for application via the transistor Q1 to the bus conductor.

When the bus driver circuit is not feeding a positive-going signal to the bus conductor it must present a very high impedance to that conductor and that is achieved by the node N25 being at a positive potential so as to turn off the transistors Q1 and Q2. In that condition it is possible that a negative-going voltage transition on the bus conductor could produce a negative transition on the node N25 through the capacitor C which could turn on the transistors Q1 and Q2 and interfere with the signals on the bus conductor. In order to prevent that happening, the transistor Q8 is provided directly connecting the node N25 to the positive supply conductor 1 and that transistor is turned on when the bus driver circuit is quiescent or non-active. The conductivity of the transistor Q8 is controlled by the output from the inverter I4 which is negative when the bus driver circuit is in its quiescent or non-active condition. The output of the inverter I4 is derived from the state of the latch formed by the NAND gates A1 and A2 which retains the state of the input signal applied to the terminal T1.

The transistor Q7, having its gate connected to its drain, serves to respond to the current from the current source S3 to produce at the node N6, where it is connected to the emitter of the transistor Q5, a voltage that is close to the threshold voltage of the transistor Q2. The voltage at the node N6 is added to the negative forward conduction voltage of the diode-connected bipolar transistor Q5 and is applied to the drain of the FET Q4. When a positive input signal is applied to the terminal T1 the latch formed by the gates A1 and A2 provides a positive output voltage at the output of the gate A1 which after inversion by the inverter I3 appears as a negative voltage at the gate of the transistor Q4. That renders the transistor Q4 conducting so that the augmented voltage at the node N6 is applied to the base of the transistor Q6. The transistor Q6 acts as an emitter follower to apply that voltage to the node N25, the transistor Q6 drawing current out of the node N25 into the current source S4 to bring the voltage on the node N25 rapidly to the threshold point of the transistor Q2 so that there is a minimum turn on delay of the output amplifier formed by transistors Q1 and Q2. At that time the current source S2 is connected through the closed switch B to cause the node N25 to slew negatively and provide the positive-going transition at a controlled rate on the bus conductor.

When the bus driver circuit is to be turned off at the end of a positive signal, a negative signal is applied to the terminal T1 and the switch B is open-circuited. The latch formed by the gates A1 and A2 does not change its state immediately so that the transistor Q4 remains conducting and the transistor Q8 remains non-conducting. Because of the disconnection of the current source S2 from the node N25 that node moves positively (down) to the threshold value of the transistor Q2 by charging of the capacitor C by the current from the source S1. When the voltage on the node N25 reaches the threshold value of the transistor Q2, the transistor Q6 turns on and starts to sink the current from the source S1 into the source S4 and in doing so raises the voltage at the node N5 positively. That rise in voltage is fed through the inverter I2 and causes the latch to change state so that the transistor Q4 becomes non-conducting and the transistor Q8 becomes conducting. When that happens the high impedance state of the transistors Q1 and Q2 is restored and the short-circuiting of the node N25 to the conductor 1 is re-established.

FIG. 2A shows an example of the input signal and FIG. 2B shows the waveform applied to the bus conductor. Note that the transitions of the input signal are substantially aligned with the starts of the ramps forming the transitions of the bus waveform. The transitions in FIG. 2B are straight because they are produced by the voltage on a capacitor char by a controlled current.

Preferably the components of the bus driver circuit are formed on a single integrated circuit, except possibly for the capacitor C. The current sources S1, S2, S3 and S4 can be of any convenient design.

It is possible that other sources driving the bus conductor can make it more positive than the conductor 1 and under such circumstances a reverse current could be forced through the transistors Q1 and Q2 that are connected to the bus. In order to prevent that happening because damage to the transistors could result, the schottky diode D is connected in series with the transistor Q1 and the transistor Q3 (which is connected to act as a diode) is connected in series with the transistor Q2 to block the reverse current flow.

Two bus driver circuits can be connected to a two-wire bus as shown in FIG. 3. The bus driver circuit 100 corresponds to the bus driver circuit 100 shown in FIG. 1. The bus driver circuit 100' corresponds to a bus driver circuit of reverse polarity construction, as described above, connected to the other wire of a two-wire bus.

We claim:

1. A bus driver circuit, having an active state for driving a bus to one binary state and an inactive state for providing a high impedance output in the other binary state, having a first bus driver comprising:

a control circuit coupled to an input of said bus driver circuit and receiving a binary input signal;

an output amplifier coupled to said control circuit and driving said bus to said one binary state, a capacitor being connected from an output to an input of said output amplifier for controlling a slew rate of transitions of an output signal from said output amplifier; and a controllable clamp coupled to said control circuit for connecting the input of said output amplifier to a point maintained at a reference voltage through a low impedance for placing said amplifier in said high impedance state when said bus driver circuit is in said inactive state.

2. A bus driver circuit according to claim 1 including a first current source permanently connected to the input of said amplifier and a second current source of opposite polarity to and producing a current of greater magnitude than the first current source that is selectively applied to the input of said amplifier under the control of the input signal so as to produce the transitions of controlled slew rate in the output signal.

3. A bus driver circuit according to claim 1 wherein said controllable clamp comprises a transistor having a control electrode connected to receive a control voltage derived from the input signal.

4. A bus driver circuit according to claim 1 including means responsive to the input signal for rapidly changing voltage at the input of the amplifier from the reference voltage to the threshold voltage of conduction of the amplifier at the start of said output signal to be applied to the bus.

5. A bus driver circuit according to claim 4 wherein the means for rapidly changing the voltage at the input of the amplifier comprises a source of a voltage substantially equal to the threshold voltage and a switch in a current path connecting the voltage source to the input of the amplifier.

6. A bus driver circuit according to claim 1 wherein said control circuit is responsive to voltage at the input of the amplifier for controlling the clamp.

7. A bus driver circuit according to claim 6 wherein the clamp is operated when the transition at the end of said output signal is completed.

8. A bus driver circuit according to claim 6 wherein said control circuit includes a latch that is also responsive to the input signal, the latch having an output that is connected to control the clamp.

9. A bus driver circuit according to claim 8 wherein an inverted output of said latch is connected to control a switch in a current path connecting a voltage source to the input of the amplifier.

10. A bus driver circuit according to claim 1 further comprising a second bus driver, receiving said binary input signal, which provides output signals of the opposite polarity to those provided by the first bus driver.

* * * * *